(12) United States Patent
Fender (10) Patent No.: US 7,010,442 B2
(45) Date of Patent: Mar. 7, 2006

(54) SYSTEMS AND METHODS FOR OPERATING A MEASUREMENT AND TESTING INSTRUMENT

(75) Inventor: Michael R. Fender, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 154 days.

(21) Appl. No.: 10/638,217

(22) Filed: Aug. 7, 2003

(65) Prior Publication Data

US 2005/0033536 A1   Feb. 10, 2005

(51) Int. Cl.
*G06F 19/00* (2006.01)
(52) U.S. Cl. .................. 702/68; 345/163; 345/164
(58) Field of Classification Search .............. 345/156, 345/157, 161, 163, 164, 167; 702/67, 68
See application file for complete search history.

(56) References Cited

U.S. PATENT DOCUMENTS

| | | | | |
|---|---|---|---|---|
| 5,129,722 A | * | 7/1992 | Mader et al. | 356/73.1 |
| 5,371,851 A | * | 12/1994 | Pieper et al. | 345/501 |
| 5,953,009 A | * | 9/1999 | Alexander | 715/771 |
| 6,128,006 A | * | 10/2000 | Rosenberg et al. | 345/163 |
| 6,246,408 B1 | * | 6/2001 | Alexander | 345/440.1 |
| 6,326,987 B1 | * | 12/2001 | Alexander | 715/771 |
| 6,697,754 B1 | * | 2/2004 | Alexander | 702/119 |
| 6,703,550 B1 | * | 3/2004 | Chu | 84/609 |
| 2001/0000964 A1 | * | 5/2001 | Alexander | 345/440 |
| 2002/0063712 A1 | * | 5/2002 | Ilic | 345/440 |
| 2002/0118168 A1 | * | 8/2002 | Hinckley et al. | 345/163 |
| 2003/0068053 A1 | * | 4/2003 | Chu | 381/118 |
| 2003/0160828 A1 | * | 8/2003 | Treibach-Heck et al. | 345/780 |
| 2004/0135819 A1 | * | 7/2004 | Maa | 345/840 |
| 2004/0267470 A1 | * | 12/2004 | Fender et al. | 702/67 |
| 2005/0024333 A1 | * | 2/2005 | Bohn | 345/163 |

\* cited by examiner

*Primary Examiner*—Carol S. W. Tsai (57) ABSTRACT

Systems and methods for implementing user input are provided. One such method includes: receiving a first user input provided via a first component of a pointing device, moving a cursor displayed on a display device responsive to the first user input, receiving a second user input provided by rotating a second component of the pointing device, and modifying an item corresponding to a current location of the cursor.

17 Claims, 8 Drawing Sheets

SYSTEMS AND METHODS FOR OPERATING A MEASUREMENT AND TESTING INSTRUMENT

BACKGROUND

Modern oscilloscopes are powerful and complex tools for performing various tasks. In performing tasks, an operator often uses a user interface (UI) of the oscilloscope. Navigating the UI of such an oscilloscope can often be difficult and time consuming. For example, past implementations of the UI have required a user to navigate menus and dialogs to provide user-input. Using menus and dialogs to provide user-input has been, unfortunately, a slow and cumbersome process.

SUMMARY

An embodiment of a method for operating a measurement and testing instrument includes receiving a first user input provided via a first component of a pointing device, moving a cursor displayed on a display device responsive to the first user input, receiving a second user input provided by rotating a second component of the pointing device, and modifying an item corresponding to a current location of the cursor.

An embodiment of a system for operating a measurement and testing instrument includes an input-execution module for modifying an item displayed on a display device responsive to a second user input provided by rotating a second component of a pointing device, and an input-dispatch module for passing the second user input to the input-execution module responsive to a cursor being displayed at a location corresponding to the input-execution module, wherein a location of the cursor is responsive to a first user input provided by a first component of the pointing device.

Other systems, methods, features and/or advantages will be or may become apparent to one with skill in the art upon examination of the following figures and detailed description. It is intended that all such additional systems, methods, features, and/or advantages be included within this description and be protected by the accompanying claims.

BRIEF DESCRIPTION OF THE DRAWINGS

In the drawings, like reference numerals designate corresponding parts throughout the several views. Furthermore, the components in the drawings are not drawn to scale.

DETAILED DESCRIPTION

As will be described in more detail below, systems and methods may allow a user to quickly and easily operate a measurement and testing instrument. For example, a user may move a mouse to position a cursor over a desired item displayed by a measurement and testing instrument (MTI), and may then rotate a mouse-wheel to modify the displayed item. Clicking on the item to be modified is not required; a current position of the cursor is used by the MTI to identify the item to be modified.

Figure 1:
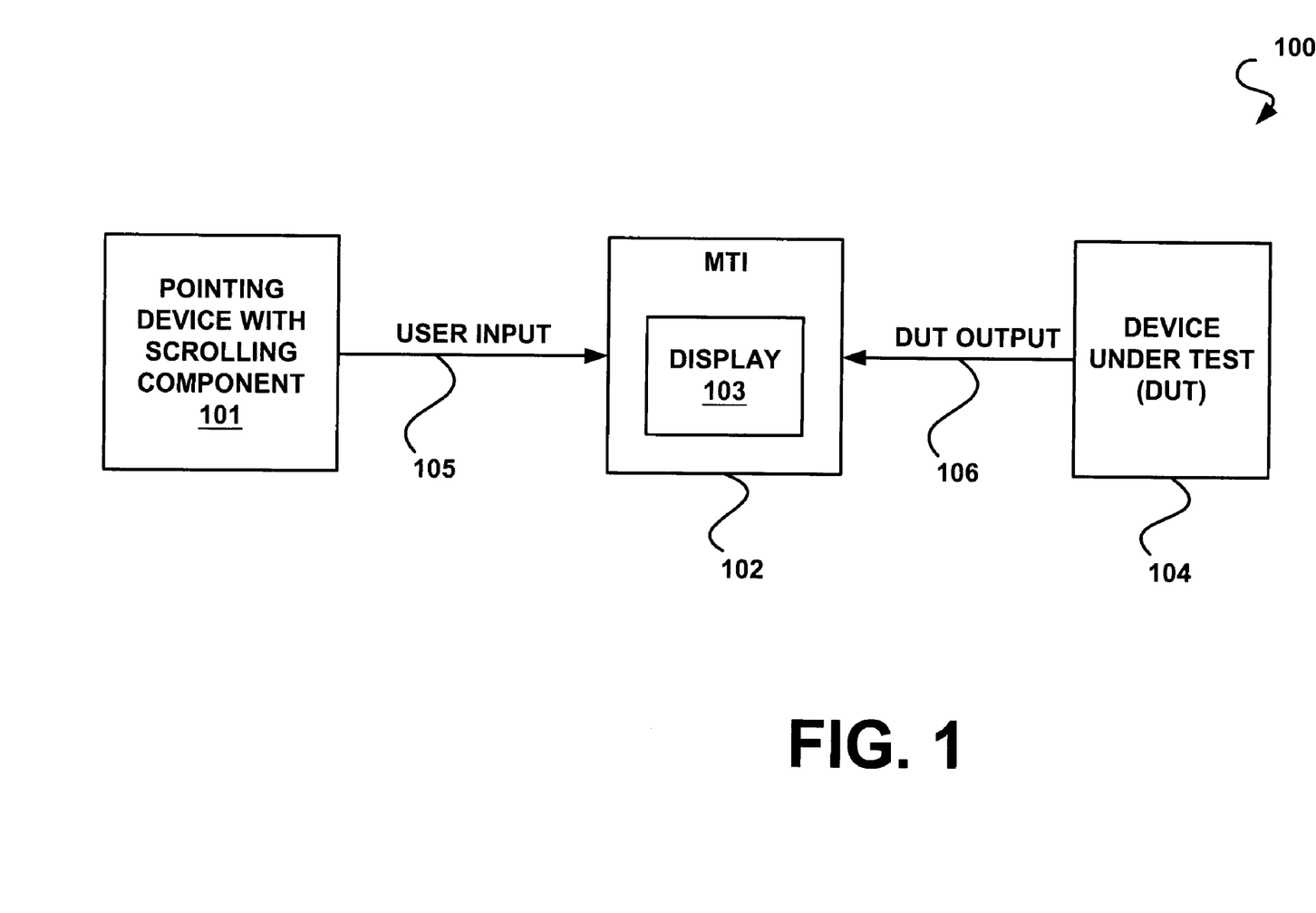
FIG. 1 is a block diagram depicting an embodiment of a measurement system.

FIG. 1 is a block diagram depicting an embodiment of a measurement system 100. The measurement system 100 includes a measurement and testing instrument (MTI) 102 and a device under test (DUT) 104. The MTI 102 is configured to measure characteristics of signals 106 provided by the DUT 104. Note that the signals 106 may be provided via a probing instrument (e.g., a voltage probe) that is used to probe the DUT 104. The MTI 102 may be, for example, an oscilloscope, a spectrum analyzer, a logic analyzer, a vector analyzer, a network analyzer, or a time interval analyzer. The DUT 104 may be any electronic device or circuit that is to be tested.

The MTI 102 includes a display 103 that displays waveforms corresponding to respective signals 106 received from the DUT 104. The display 103 may be any type of display now known or later developed. The display 103 may be, for example, among others, a cathode ray tube (CRT) display, a liquid crystal display (LCD) display, or a plasma display. The MTI 102 receives user input 105 that is provided by a pointing device 101. The pointing device may be, for example, among others, a pointing device illustrated in FIGS. 2A and 2B.

Figure 2A:
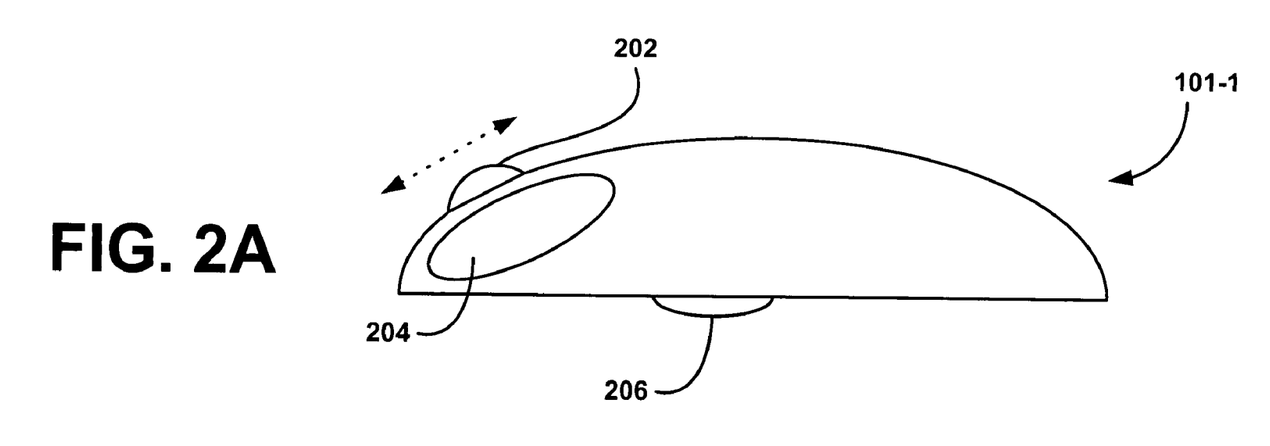
FIGS. 2A and 2B depict examples of pointing devices that may be used to provide user input to an MTI.
Figure 2B:
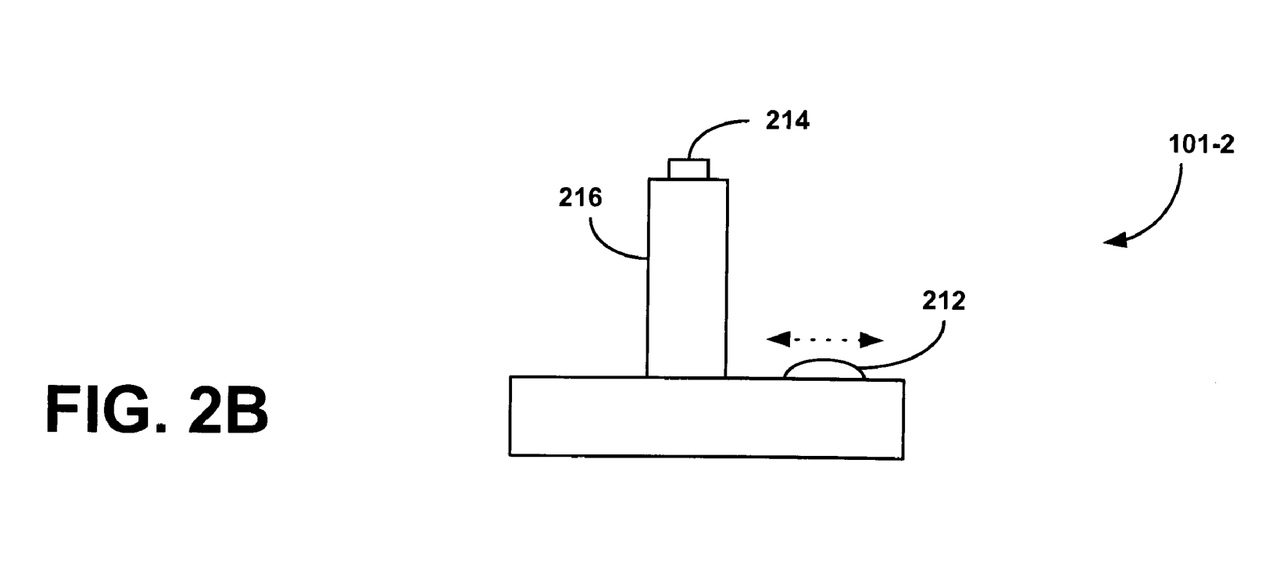

FIGS. 2A and 2B depict two examples of pointing devices that may be used to provide user input to an MTI 102: a mouse 101-1 and a joy-stick unit 101-2. The mouse 101-1 includes the scrolling component 202, the selecting component 204, and the pointing component 206. The pointing component 206 is used for moving a cursor, the selecting component 204 is used for selecting an item located below a cursor, and the scrolling component 202 is used for scrolling.

The joy-stick unit 101-2 includes the scrolling component 212, the selecting component 214, and the pointing component 216. The pointing component 216 is used for moving a cursor, the selecting component 214 is used for selecting an item located below a cursor, and the scrolling component 212 is used for scrolling. Note that other input devices may also be used within the scope of the invention including, for example, a keyboard having a rotating component for providing user input.

Figure 3:
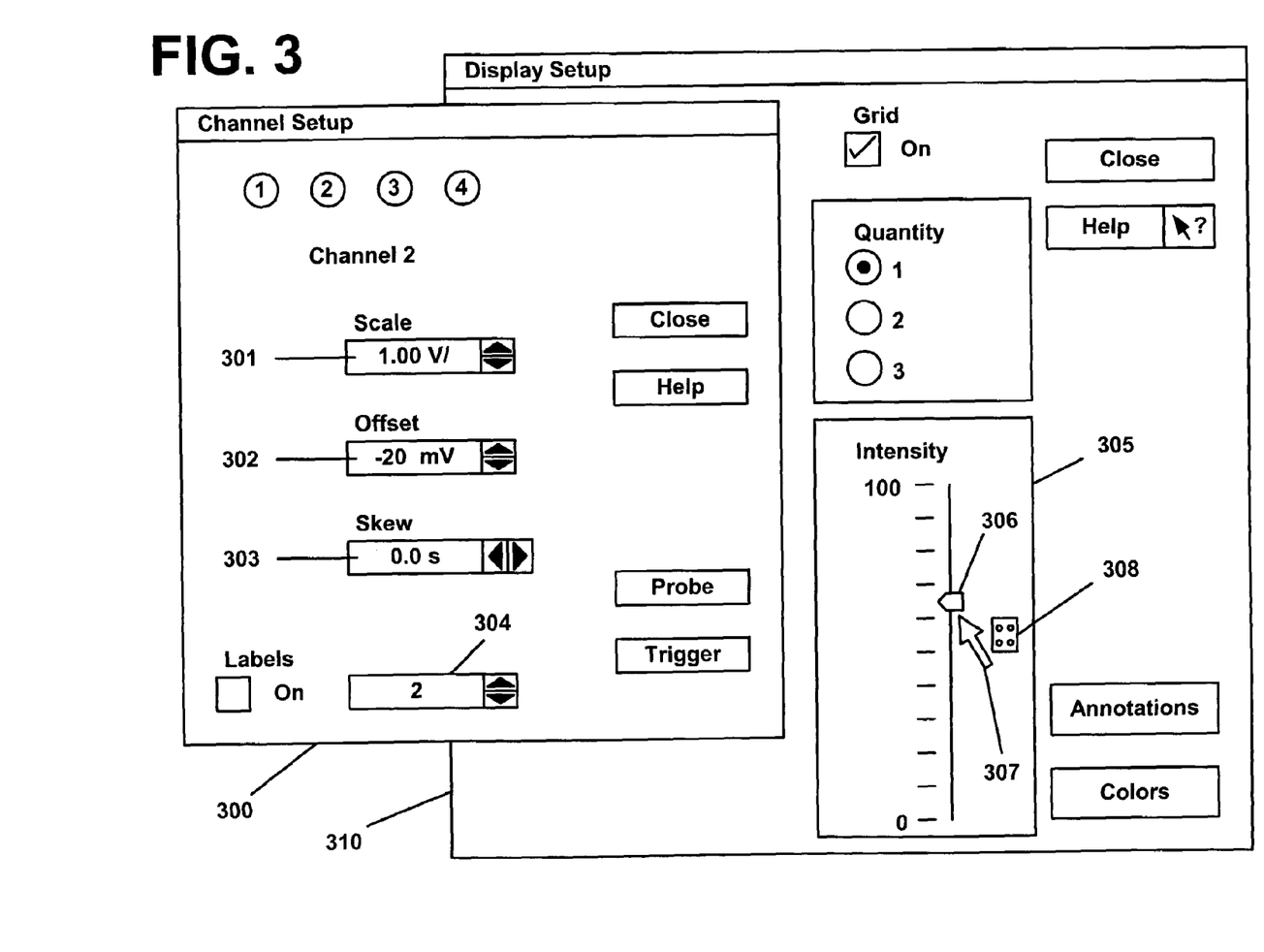
FIG. 3 is a schematic diagram depicting user-input dialogs that may be used to enable a user to provide user-input.

FIG. 3 is a schematic diagram depicting user-input dialogs 300 and 310 that may be used to enable a user to provide user-input. The user-input dialog 300 includes examples of user input entry fields 301–304: the user-input entry field 301 may be used for specifying a scale of a displayed waveform; the user-input entry field 302 may be used for specifying an offset for a displayed waveform; the user-input entry field 303 may be used for specifying a skew for a displayed waveform; and the user-input entry field 304 may be used for specifying a label for a displayed waveform. A user may position a cursor 307 over a desired input entry field (e.g., 301, 302, 303, or 304) using a pointing component of an input device (e.g., 206 (FIG. 2A) or 216 (FIG. 2B)) and may then modify the value displayed under the cursor 307 by using a scrolling component (e.g., 202 or 212 (FIGS. 2A and 2B)) of the input device.

The user-input dialog 310 includes an example of the user-input entry field 305 that may be used to provide user input. A user may position a cursor 307 over the user-input entry field 305 using a pointing component of an input device and may then modify a value identified by the level indicator 306 by using a scrolling component 202, 212 of the input device. An icon 308 may be displayed next to the cursor 307 to indicate that the cursor 307 is positioned over an input entry field that is responsive to the scrolling component 202, 212.

In this example, the value identified by the level indicator 306 may be modified using the scrolling component 202, 212 even while the user-input dialog 310 is not "in-focus" (e.g., is displayed as a back-ground dialog). In this manner, a user need not consider which dialog or entry field is in-focus; the user can simply point the cursor 307 to the desired entry field and use the scrolling component 202, 212 to modify a corresponding value.

Figure 4A:
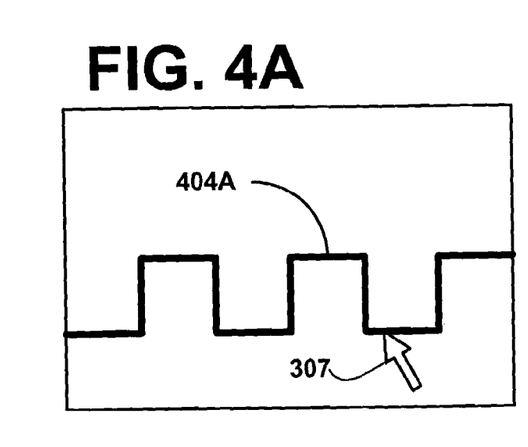
FIGS. 4A–4D depict examples of how a scrolling component may be used to modify a displayed waveform.
Figure 4B:
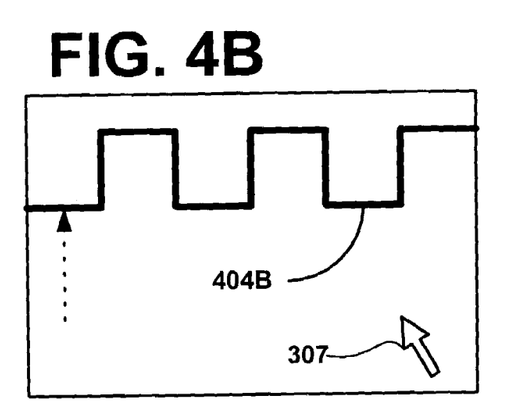
Figure 4C:
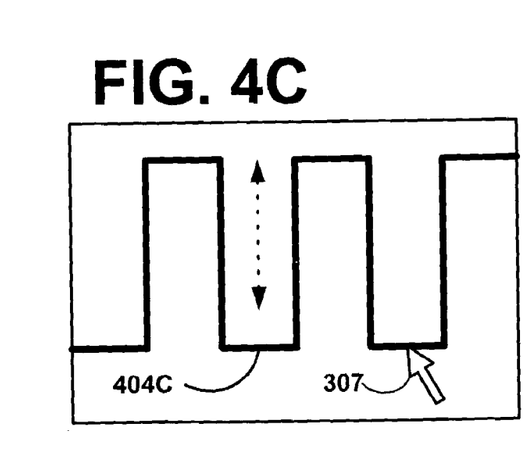
Figure 4D:
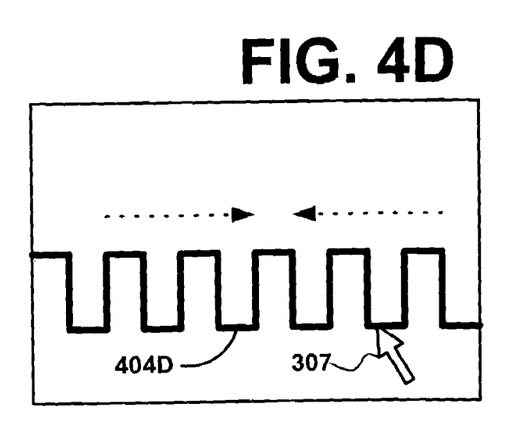

FIGS. 4A–4D depict examples of how a scrolling component 202, 212 (FIGS. 2A and 2B) of an input device may be used to modify a displayed waveform. A user may position a cursor 307 over waveform 404A using a pointing component of an input device, and may then modify the waveform 404A using the scrolling component 202, 212 of the input device. For example, the scrolling component 202, 212 may be configured to change:

1. the offset of the waveform 404A as depicted in FIG. 4B;

2. the scale of the waveform 404A, as depicted in FIG. 4C; or 3. the time-base of the waveform 404A, as depicted in FIG. 4D.

Therefore, the waveform 404A may be modified to resemble any of the waveforms 404B, 404C, or 404D using the scrolling component 202, 212.

Figure 5:
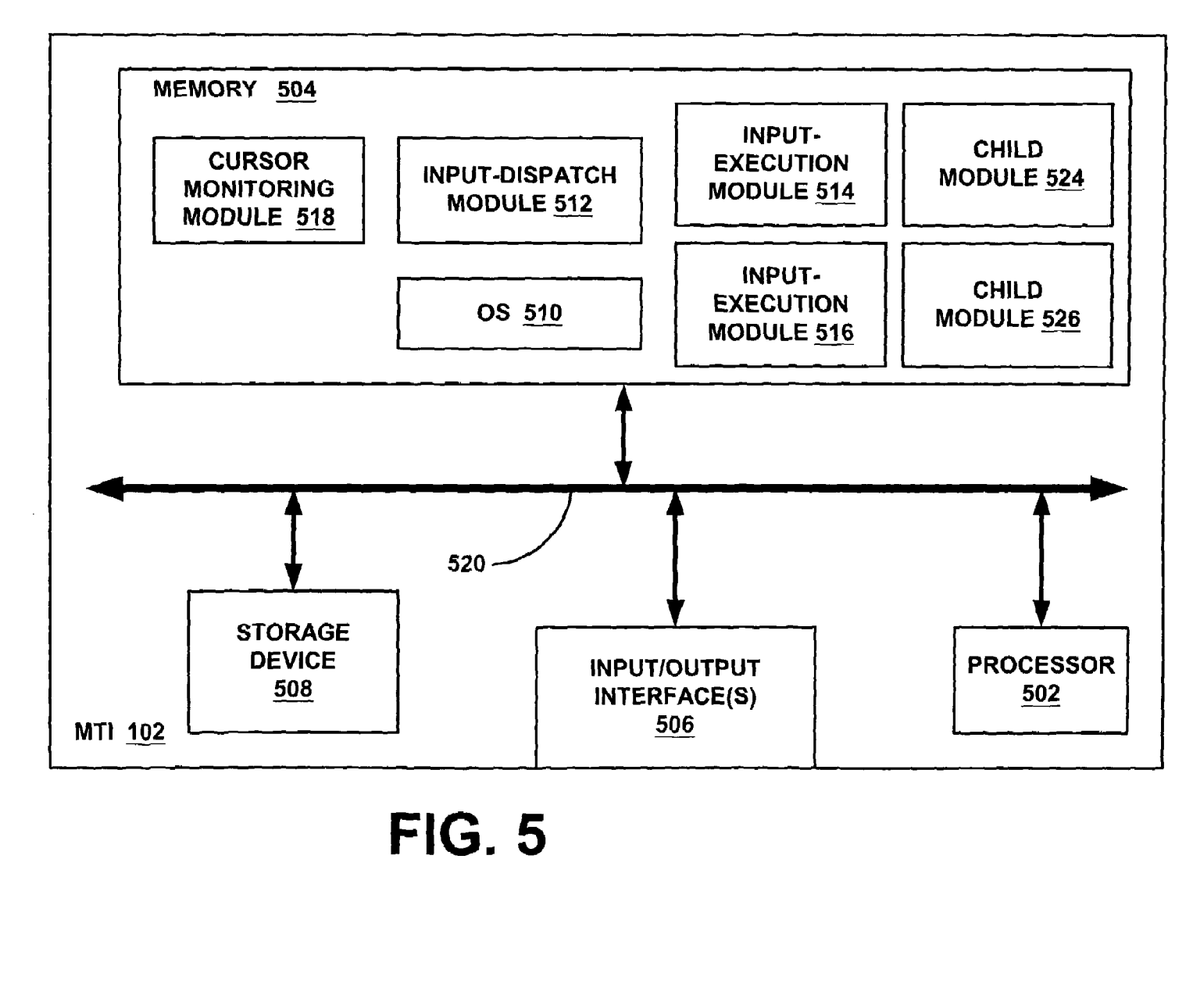
FIG. 5 is a functional block diagram of an exemplary MTI.

FIG. 5 is a functional block diagram of an exemplary MTI 102. The MTI 102 may be, for example, a digital oscilloscope designed to acquire, analyze and display a wide variety of signals. Generally, in terms of hardware architecture, as shown in FIG. 5, the components of the MTI 102 include a processor 502, memory 504, input/output (I/O) interfaces 506, and a storage device 508. These components (502, 504, 506, and 508) may be communicatively coupled via a local interface 520, which may comprise, for example, one or more buses or other wired or wireless connections.

The local interface 520 may have additional elements, which are omitted for simplicity, such as controllers, buffers (caches), drivers, repeaters, and receivers, to enable communications. The I/O interfaces 506 may be used to communicate with one or more peripheral devices including, for example, a printer, a copier, a keyboard, a mouse, and/or a monitor, etc.

The processor 502 is a hardware device for executing software, particularly that stored in memory 504. The processor 502 may be a custom made or commercially available processor, a central processing unit (CPU), an auxiliary processor among several processors associated with the MTI 102, a semiconductor based microprocessor (in the form of a microchip or chip set), or generally any device for executing software instructions. When the MTI 102 is in operation, the processor 502 is configured to execute software stored within the memory 504, to communicate data to and from the memory 504, and to generally control operations of the MTI 102 pursuant to the software.

The memory 504 can include any one or combination of volatile and/or non-volatile memory elements now known or later developed. For example, the memory 504 may comprise random access memory (RAM), read only memory (ROM), a hard disk, a tape, and/or a compact disk ROM (CD-ROM), among others. Note that the memory 504 can have a distributed architecture, where various components are situated remote from one another, but can be accessed by the processor 502.

The software applications in memory 504 include an operating system (OS) 510 and an input-dispatch module 512. The OS 510 essentially controls the execution of the other applications, and provides scheduling, input-output control, file and data management, memory management, and/or communication control, among other functionality. The input-dispatch module 512 may be used to forward user-input data to an input-execution module 514 or 516 that corresponds to an item that is currently displayed under a cursor.

An optional cursor monitoring module 518 captures cursor movements over dialogs and windows and records the most recent eligible item to which the cursor has pointed. The cursor monitoring module 518 may provide such recorded information to the input-dispatch module 512. When a user activates the scrolling component 202, 212 (FIGS. 2A and 2B) of an input device, the resulting user input is passed to the input-dispatch module 512 via, for example, the OS 510.

Passing the user-input to the input-dispatch module 512 prevents a "focused" or "active" module from receiving and processing the user input provided by the scrolling component 202, 212 when a cursor is located above an item corresponding to another module. The input-dispatch module 512 examines the current location of the cursor and compares it with the locations of items on the screen. If a valid recipient is found, the user-input is passed to it; otherwise the user-input can either be ignored or passed down to the OS 510. For example, the input-dispatch module 512 may forward the user-input to the input execution module 514 or 516.

An input execution module 514 or 516 can interpret (e.g., act upon), ignore, or forward user-input received from the input-dispatch module 512. For example, the input-execution modules 514 and 516 may pass user-input to their respective child modules 524 and 526. A child module 524 or 526 may similarly interpret, ignore, or forward user-input received from the input-dispatch module 512 or from an input-execution module 514 or 516 respectively.

A first module may forward user-input data to a second module responsive to determining that a cursor is currently located over an item corresponding to the second module, or that the second module corresponds to an eligible item over which the cursor was most recently located. Such determination may be made by tracking which eligible item the cursor most recently pointed to or by searching a list of modules corresponding to eligible items.

The cursor monitoring module 518 and the input-dispatch module 512 may each be a source program, an executable program (e.g., object code), a script, or any other entity comprising a set of instructions to be executed. Furthermore, the cursor monitoring module 518 and the input-dispatch module 512 can be embodied in any computer-readable medium for use by or in connection with an instruction execution system, apparatus, or device, such as a computer-based system or a processor-containing system. In the context of this disclosure, a "computer-readable medium" can be any means that can store, communicate, propagate, or transport a program for use by or in connection with the instruction execution system, apparatus, or device. The computer-readable medium can be, for example, among others, an electronic, magnetic, optical, electromagnetic, infrared, or semiconductor system, apparatus, device, or propagation medium now known or later developed.

Figure 6A:
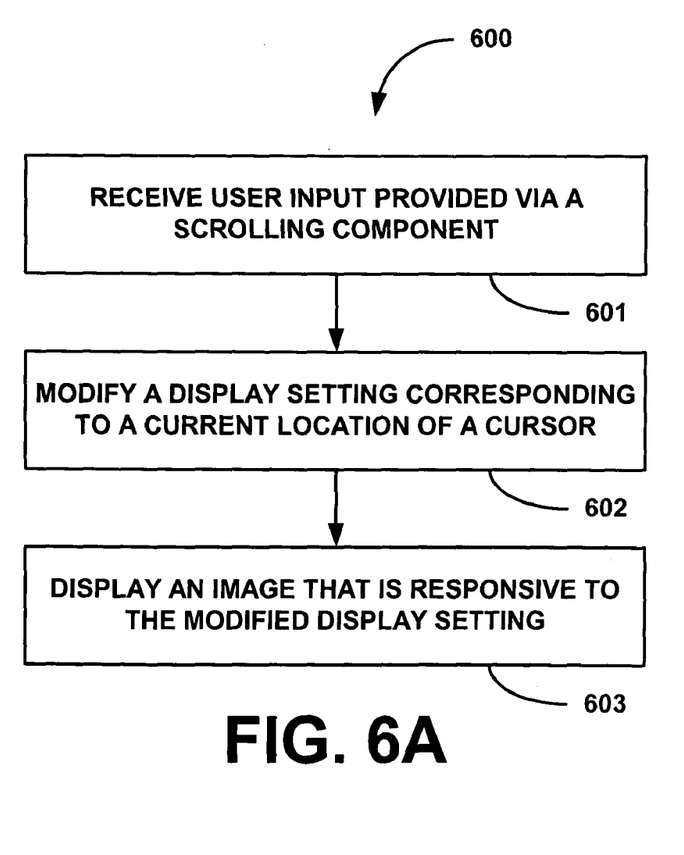
FIG. 6A is a flow chart depicting an embodiment of a method for responding to user-input provided via a scrolling component of an pointing device.

FIG. 6A is a flow chart depicting an embodiment of a method 600. As indicated in block 601, user input provided via a scrolling component 202, 212 (FIGS. 2A and 2B) of an input device is received. A display setting (e.g., specifying the scale, offset or skew of a waveform) corresponding to a current location of a cursor (e.g., over an entry field) is modified, as indicated in block 602. An image that is responsive to the modified display setting is displayed, as indicated in block 603. The modified image may be, for example, a waveform corresponding to the modified display setting.

Figure 6B:
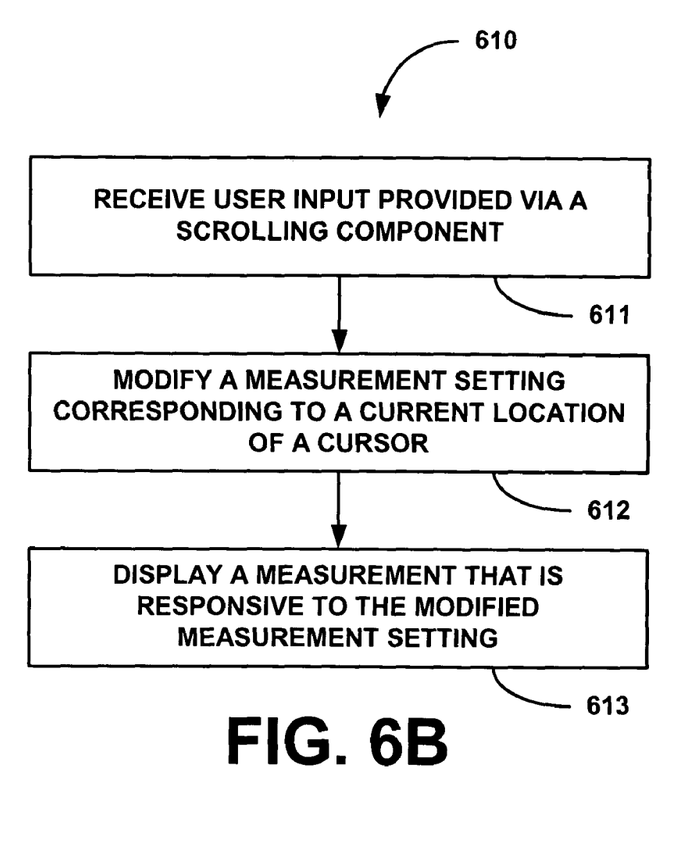
FIG. 6B is a flow chart depicting another embodiment of a method for responding to user-input provided via a scrolling component of an pointing device.

FIG. 6B is a flow chart depicting an embodiment of a method 610. As indicated in block 611, user input provided via a scrolling component 202, 212 (FIGS. 2A and 2B) of an input device is received. A measurement setting (e.g., a channel selection) corresponding to a current location of a cursor is modified, as indicated in block 612. A measurement that is responsive to the modified measurement setting is displayed, as indicated in block 613. The displayed measurement may correspond to, for example, a waveform corresponding to the selected channel.

Figure 7A:
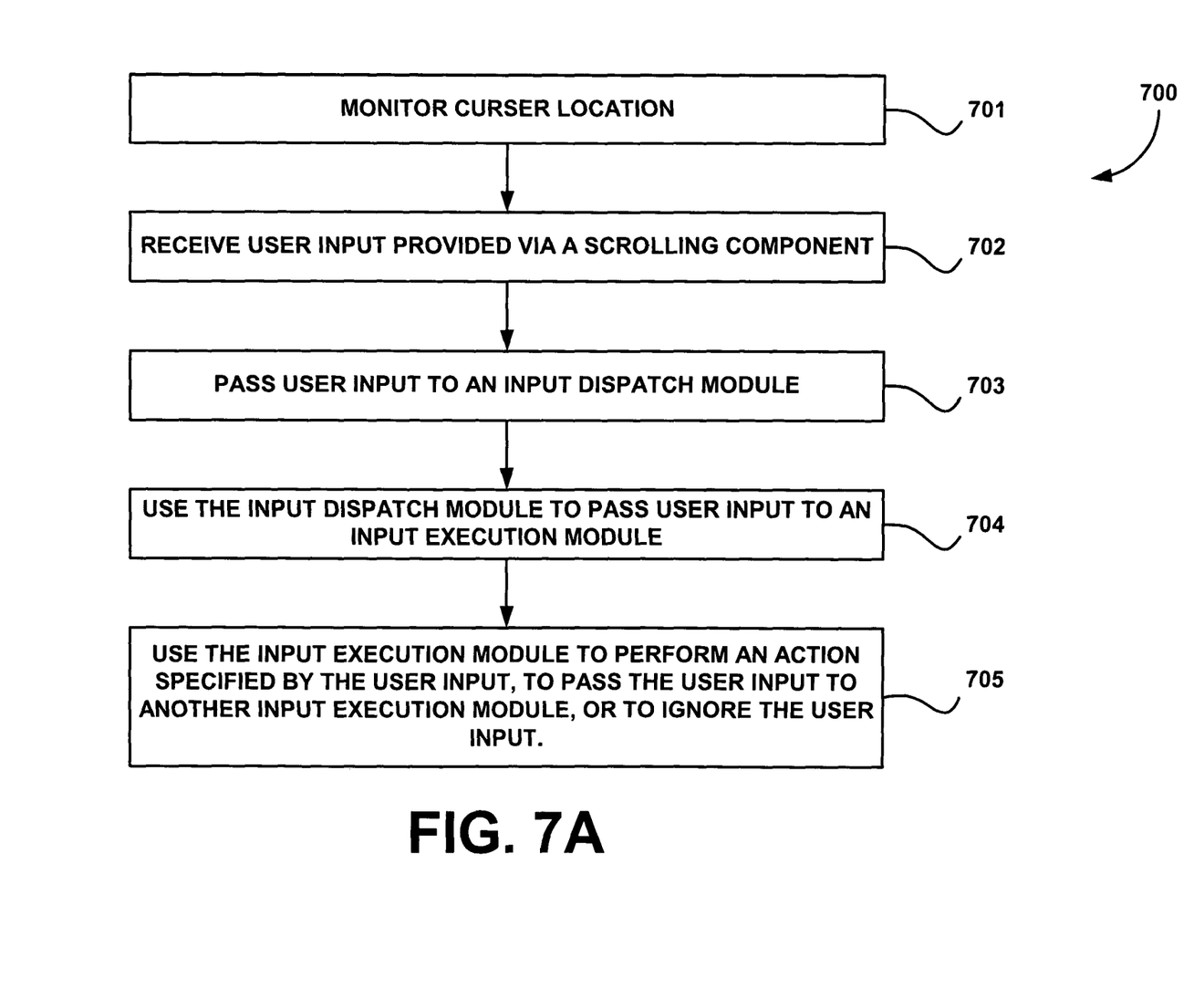
FIG. 7A is a flow chart depicting another embodiment of a method for responding to user-input provided via a scrolling component of an pointing device.

FIG. 7A is a flow chart depicting an embodiment of a method 700. As indicated in block 701, a cursor location is monitored. User input provided via a scrolling component 202, 212 (FIGS. 2A and 2B) of an input device is received, as indicated in block 702. User input is passed to an input dispatch module 512 (FIG. 5), as indicated in block 703. The user input is passed by the input dispatch module 512 to an input execution module 514 or 516 (FIG. 5), as indicated in block 704. An action specified by the user input is performed by the input execution module 514 or 516. Alternately, the used input is passed to another input execution module, passed to a child module 524 or 526 (FIG. 5), or simply ignored, as indicated in block 705.

Figure 7B:
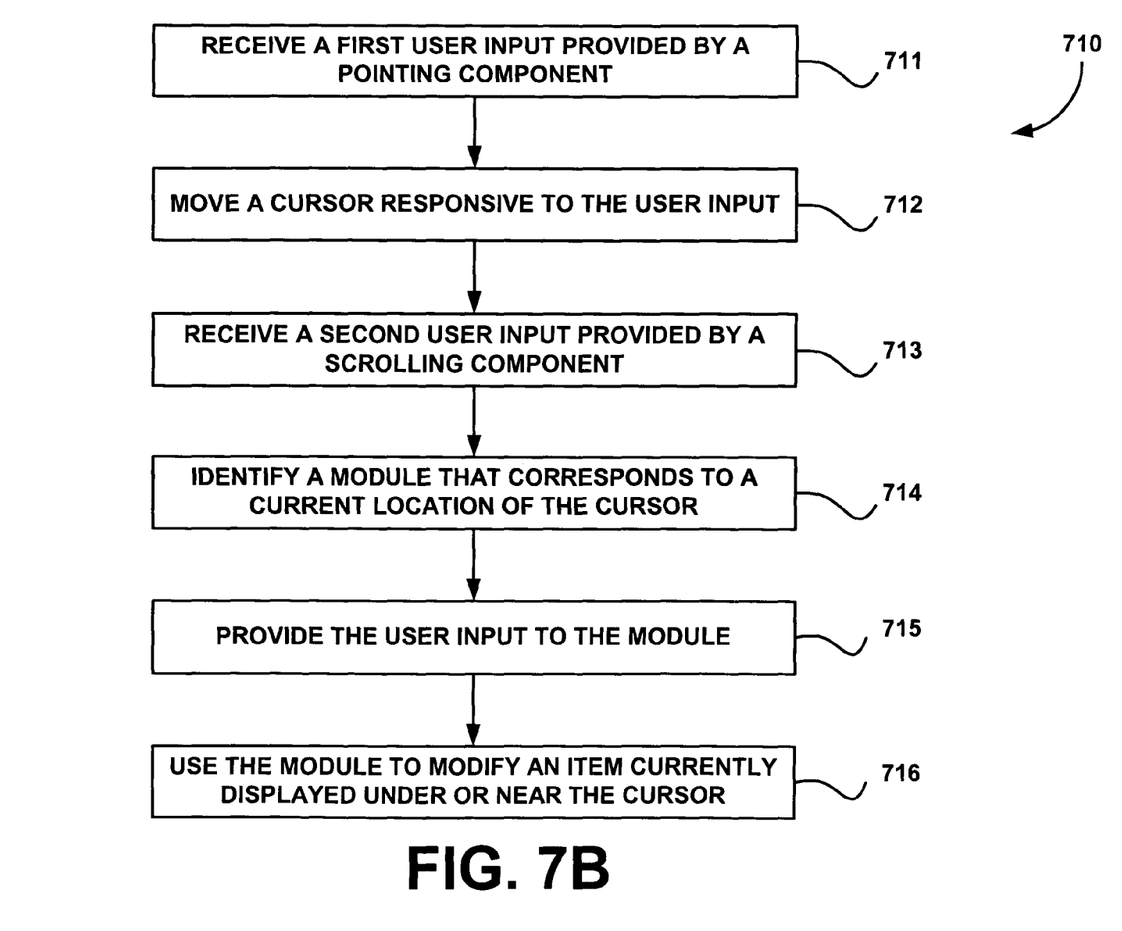
FIG. 7B is a flow chart depicting another embodiment of a method for responding to user-input provided via a scrolling component of an pointing device.

FIG. 7B is a flow chart depicting an embodiment of a method 710. As indicated in block 711, a first user input provided by a pointing component (e.g., 206 or 216 (FIGS. 2A and 2B) of an input device is received. A cursor is moved responsive to the user input, as indicated in block 712. A second user input provided by a scrolling component 202, 212 (FIGS. 2A and 2B) of the input device is received, as indicated in block 713. A module that corresponds to a current location of the cursor is identified, as indicated in block 714. For example, the identified module may be input-execution module 514 or 516 (FIG. 5). The user input is provided to the identified module, as indicated in block 715. An item currently displayed under or near the cursor is modified by the module, as indicated in block 716. The modified item may be, for example, a waveform, a measurement value, a measurement setting, or a display setting, among others.

It should be emphasized that the above-described embodiments are merely possible examples, among others, of the implementations. Many variations and modifications may be made to the above-described embodiments. All such modifications and variations are intended to be included herein within the scope of the disclosure and protected by the following claims.

What is claimed is:

1. A method for operating a measurement and testing instrument configured to measure a characteristic of a device-under-test, the method comprising the steps of:
   receiving a first user input provided via a first component of a pointing device;
   moving a cursor displayed on a display device responsive to the first user input;
   receiving a second user input provided by rotating a second component of the pointing device; and
   modifying an item displayed on the display device responsive to the second user input and responsive to where the cursor is located when the second user input is received, the item corresponding to a measurable characteristic of the device-under-test.

2. The method of claim 1, wherein the item is displayed near the cursor when the second user input is received.

3. The method of claim 2, wherein the method is implemented by one of an oscilloscope, a spectrum analyzer, a logic analyzer, a vector analyzer, a network analyzer, and a time interval analyzer.

4. The method of claim 1, wherein the pointing device comprises one of a mouse, a touch-pad, a track-ball and a joystick.

5. The method of claim 1, wherein the item specifies one of a display setting and a measurement setting.

6. The method of claim 1, further comprising modifying a measurement result displayed by the display device responsive to the second user input.

7. The method of claim 6, wherein the measurement result comprises at least one of a waveform and a measurement value.

8. The method of claim 1, wherein the second component comprises a rolling mechanism.

9. The method of claim 1, wherein an icon is displayed next to the cursor to indicate that the item is responsive to rotating the second component of the pointing device.

10. A measurement and testing system comprising:
    an input-execution module for modifying an item displayed on a display device responsive to a second user input provided by rotating a second component of a pointing device, the item corresponding to a measurable characteristic of a device-under-test; and
    an input-dispatch module for passing the second user input to the input-execution module responsive to a cursor being displayed at a location corresponding to the input-execution module, wherein a location of the cursor is responsive to a first user input provided by a first component of the pointing device.

11. The measurement and testing system of claim 10, wherein the item specifies one of a display setting and a measurement setting.

12. The measurement and testing system of claim 10, wherein the measurement and testing instrument is one of an oscilloscope, a spectrum analyzer, a logic analyzer, a vector analyzer, a network analyzer, and a time interval analyzer.

13. The measurement and testing system of claim 10, wherein the first and second user inputs are provided by a pointing device selected from a group consisting of one of a mouse, a touch-pad, a track-ball and a joystick.

14. A measurement and testing system comprising:
    means for receiving a first user input provided via a first component of a pointing device and a second user input provided by rotating a second component of the pointing device;
    means for moving a cursor displayed on a display device responsive to the first user input;

means for modifying an item displayed on the display device responsive to the second user input and responsive to where the cursor is located when the second user input is received, the item corresponding to a measurable characteristic of a device-under-test.

15. The measurement and testing system of claim 14, wherein the method is implemented by one of an oscilloscope, a spectrum analyzer, a logic analyzer, a vector analyzer, a network analyzer, and a time interval analyzer.

16. The measurement and testing system of claim 14, wherein the pointing device comprises one of a mouse, a touch-pad, a track-ball and a joystick.

17. The measurement and testing system of claim 14, wherein an icon is displayed next to the cursor to indicate that the item is responsive to rotating the second component of the pointing device.

* * * * *